United States Patent [19]

Engeler et al.

[11] 4,165,537

[45] Aug. 21, 1979

[54] ANALOG CHARGE TRANSFER APPARATUS

[75] Inventors: William E. Engeler; Richard D. Baertsch, both of Scotia, N.Y.

[73] Assignee: General Electric Company, Schenectady, N.Y.

[21] Appl. No.: 934,012

[22] Filed: Aug. 16, 1978

[51] Int. Cl.$^2$ .................. G11C 27/00; G11C 19/28
[52] U.S. Cl. .................. 365/45; 307/221 D; 357/24; 365/183
[58] Field of Search ............ 365/45, 183; 307/221 D; 357/24

[56] References Cited
PUBLICATIONS

D.V. McCaughan et al., Phase-Referred Input: A Simple New Linear C.C.D. Input Method, Electronics Letters, 12/9/76, vol. 12, No. 25, pp. 682.
Hiltebeitel et al., Fractional Charge Packet Generator, IBM Tech. Disc. Bull., vol. 20, No. 8, 1/78, pp. 3014–3016.

Primary Examiner—Stuart N. Hecker
Attorney, Agent, or Firm—Julius J. Zaskalicky; Joseph T. Cohen; Marvin Snyder

[57] ABSTRACT

Input sampling circuits are described for converting an analog signal into charge samples for charge transfer devices.

5 Claims, 6 Drawing Figures

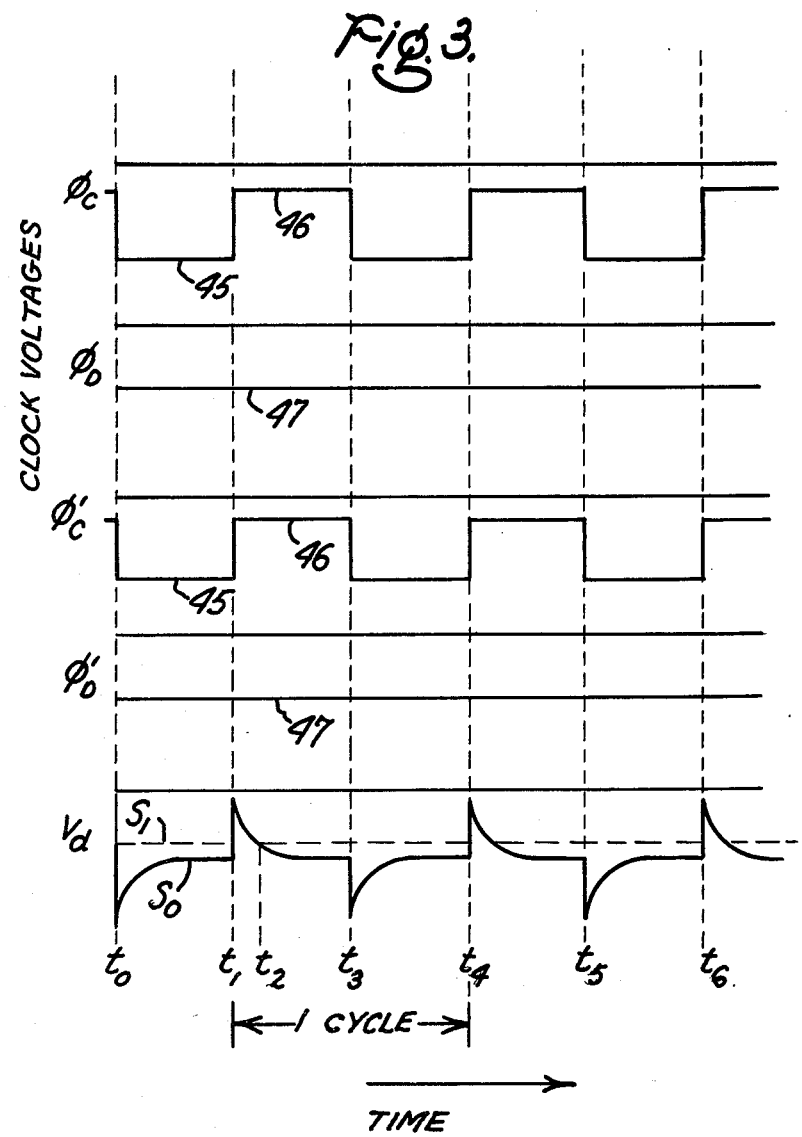

ANALOG CHARGE TRANSFER APPARATUS

This invention relates in general to charge transfer apparatus, and in particular relates to circuits for converting a signal into packets of charge corresponding to samples of the signal.

One commonly used and highly advantageous class of circuits for effecting the conversion of an analog signal into charge samples or packets are circuits referred to as "fill and spill" circuits. In basic structure, this class of circuits includes a storage region in a semiconductor substrate of one conductivity type and a source of mobile charge separated from the storage region by a barrier region. The source of mobile charge may comprise a region of opposite conductivity type in the substrate. The surface potential of the storage region is set by an analog signal applied to an electrode insulatingly overlying the storage region. The barrier region is provided with a reference potential established by applying a reference voltage to a reference electrode insulatingly overlying the barrier region. During a first part of a sampling cycle, an input charging pulse is applied to the source of mobile charge to raise the potential thereof and cause charge to flow from the source through the barrier region into the storage region filling the latter with charge. During a second part of the sampling cycle, the potential of the charge source is lowered below the potential of the barrier region and excess charge in the storage region spills over the potential barrier of the barrier region into the source region until the potential of the storage region equilibrates with the potential of the barrier region. During a third portion of the cycle, the charge packet or sample formed in the storage region is transferred to another adjacent storage of the charge transfer apparatus for further processing in the charge transfer apparatus.

Typically, in the operation of such "fill and spill" circuits clocking pulses or waveforms are utilized which are different from the clocking waveforms of the main section of charge transfer apparatus. At low frequency, a properly timed waveform may be generated and applied to the input section to obtain the operation desired. However, at higher frequencies, the specially generated and timed waveform for the input section becomes more difficult to generate. One solution which has been proposed is the use of one of the clocking waveforms of the main section of the charge transfer apparatus for the input section as well. Such a solution is described in an article entitled "Phase-Referred Input: A Simple New Linear C.C.D. Input Method" by D.V. McCaughan and J. G. Harp in *Electronic Letters,* Dec. 9, 1976, Vol. 12, No. 25, p. 682. In such a case as this, the spill time or second part of a sampling cycle will be determined by the fall time of the clocking waveform. That is, in the example described above, the spilling of charge from the storage region occurs as the clocking waveform drops in potential thereby dropping the potential of the charge source and also dropping the potential in the adjacent storage region of the charge transfer apparatus. As the clocking voltage is connected directly to the charge source and the clocking voltage is connected to the electrode controlling the adjacent storage region, the potential of the charge source falls below the potential of the reference barrier prior to the dropping in potential of the adjacent storage region to a value enabling transfer of the sampling packet of charge thereto. Accordingly, if the fall time of the clocking waveform is long enough, sufficient time exists for performing the spill part of the cycle. However, when high frequency clocking waveforms are utilized, such fall times are not long enough for the spilling of excess charge and hence for accurate sampling of the analog signal.

The present invention is directed to overcoming disadvantages and limitations, such as mentioned above, in sampling circuits for charge transfer apparatus.

An object of the present invention is to provide improvements in linear input sampling circuits for charge transfer apparatus.

Another object of the present invention is to provide linear input sampling circuits for charge transfer apparatus which are useful at high frequencies.

A further object of the present invention is to provide charge transfer apparatus including analog sampling circuits which utilizes a single clock pulse for providing the functions charge input, charge transfer and charge output.

In carrying out the invention in one illustrative embodiment thereof, there is provided a substrate of semiconductor material having a major surface and of one conductivity type. A first electrode is provided insulatingly overlying a first region of the substrate adjacent the major surface. A second electrode is provided insulatingly overlying a second region of the substrate adjacent the major surface with the second region being contiguous to the first region. A region of opposite conductivity type is provided in the major surface of the substrate and coupled to the first region. A reference voltage is applied to the first electrode to deplete the first region and to establish a surface potential therein corresponding to the reference voltage. A signal voltage is applied to the second electrode to deplete the second region and to establish a surface potential therein corresponding to the signal. The region of opposite conductivity type is biased to provide a surface potential therein of a value unfavorable for the transfer of mobile charge from the region of opposite conductivity type to the first region. A third electrode is provided insulatingly overlying a third region of the substrate adjacent the major surface and contiguous to the second region. A fourth electrode is provided insultatingly overlying a fourth region of the substrate adjacent the major surface and contiguous to the fourth region. A first clock voltage is applied to the third electrode to deplete the third region and to establish a surface potential therein corresponding to the first clock voltage. A second clock voltage is applied to the fourth electrode to deplete the fourth region and to establish a surface region therein corresponding to the second clock voltage. The second clock voltage has a first value over a first portion of a cycle thereof which is unfavorable for the transfer of charge from the second region to the fourth region and having a second value over a second portion over the cycle which is favorable for the transfer of charge from the second region to the fourth region. The first clock voltage has a first value during aforementioned first portion of the cycle of the second clock voltage which inhibits the transfer of charge from the second region to the fourth region and has a second value during aforementioned second portion of the cycle of the second clock voltage which enables the transfer of charge from the second region to said fourth region. Circuit means are provided responsive to the transition in level of the second clock voltage from the aforementioned second value to the aforementioned first value to develop and apply a transient voltage of a polarity, amplitude and duration to the region of opposite conductivity type to render the potential of the region of opposite conductivity type favorable for the transfer of charge from the region of opposite conductivity type into the first region and to the second region over an initial part of the aforementioned first portion of the cycle of the second clock and favorable for the transfer of charge from the first region to the region of opposite conductivity type during the remaining part of the aforementioned first portion of the cycle of the second clock voltage. The aforementioned circuit means develops a voltage on the region of opposite conductivity type during the second portion of the cycle of the second clock voltage which is unfavorable for the transfer of charge from the region of opposite conductivity type to the first region. Thus, during the aforementioned first portion of the cycle of the second clock voltage a packet of charge is developed in the second region the magnitude of which is dependent on the magnitude of separation in potential of the signal voltage from the reference voltage in the direction favorable to the transfer of charge from the first region to the second region, and during the aforementioned second portion of the cycle of the second clock voltage the packet of charge is transferred from the second region to the fourth region.

The novel features which are believed to be characteristic of the present invention are set forth with particularity in the appended claims.

The invention itself, both as to its organizatiion and method of operation, together with further objects and advantages thereof, may best be understood by reference to the following description taken in connection with the accompanying drawings in which:

FIG. 3 is a diagram of voltage waveforms useful in explaining the operation of the charge transfer apparatus of the present invention;

Figure 1:
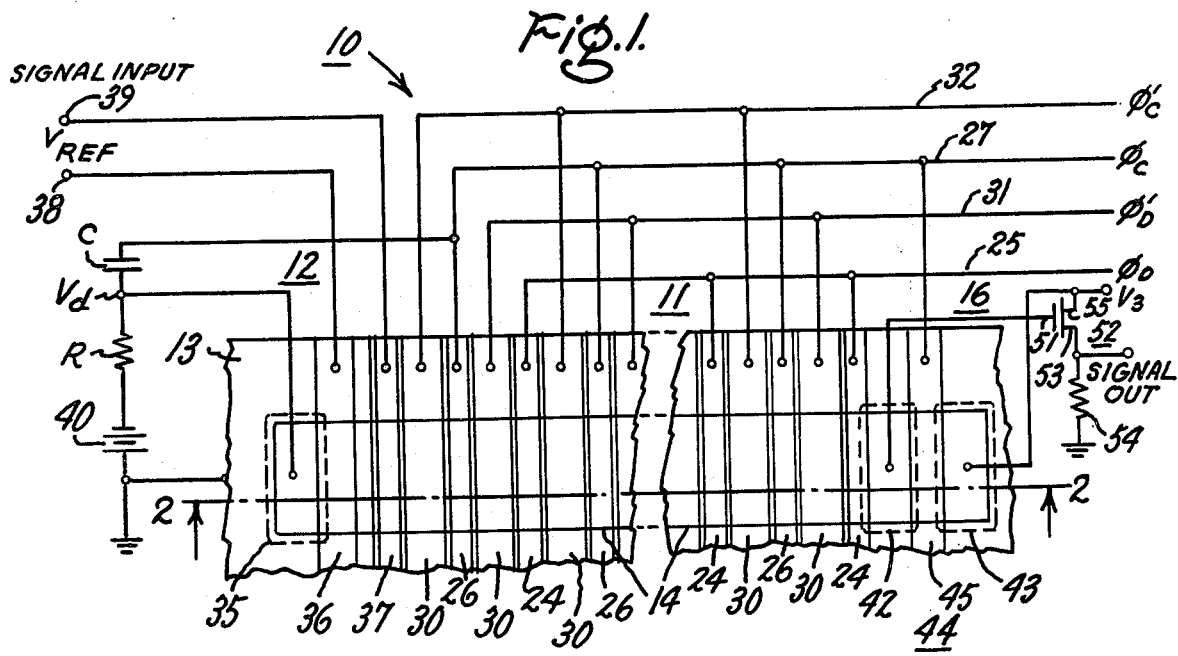
FIG. 1 is a plan view of charge transfer apparatus in the form of a charge shift register incorporating the present invention.
Figure 2:
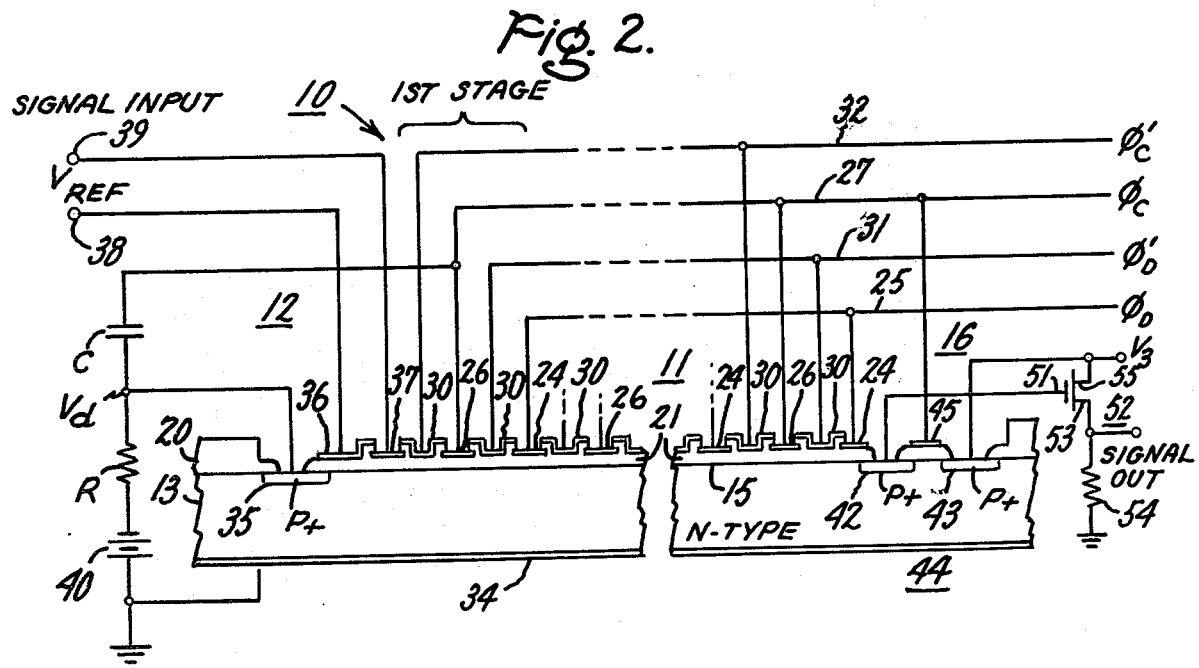
FIG. 2 is a sectional view of the apparatus of FIG. 1, taken along section lines 2—2 thereof.

Reference is now made to FIGS. 1 and 2 which show charge transfer signal processing apparatus 10 embodying the present invention. The apparatus 10, suitable for the functioning as a signal delay line for example, comprises a main section 11 including a plurality of stages, an input section for converting an analog signal into packets of charge representing signal samples of the analog signal and for introducing these packets into the main section, and an output section 16. The main section 11 of the apparatus is formed on a semiconductor substrate 13 of N-type conductivity which has a channel portion 14 of uniform width adjacent a major surface 15 of the substrate. Typically, the substrate 13 may be silicon semiconductor material of 4 ohm-cm resistivity. Overlying the major surface of the substrate 13 is a thick insulating member 20 having a thin portion 21 which is of generally rectangular outline and lies in registry with the first channel portion 14 of the substrate. A first plurality of electrodes 24 are provided on the insulating member 20 overlying the thin portion 21 thereof and orthogonal to the length thereof. Each of the electrodes 24 is of uniform length in the direction of the length of the semiconductor channel portion 14 and each of the electrodes 24 extends across the thin insulating portion 21 and the bordering thick insulation portions of insulating member 20.

A second plurality of electrodes 26 are provided on the insulating member 20 overlying the thin portion 21 thereof and orthogonal to the length thereof. Each of the electrodes 26 is of uniform length in the direction of the length of the channel portion 14 and equal to the uniform length of each of the electrodes 24 of the first plurality. Each of the electrodes 26 of the second plurality are spaced between adjacent electrodes 24 of the first plurality and each extends completely over the thin insulating portion 21 of the insulating member 20 as well as the bordering thick insulation portions thereof. An insulating layer 28 is provided over the electrodes 24 and 26 of the first and second pluralities. Preferably, the first and second plurality of electrodes 24 and 26 are constituted of doped polycrystalline silicon. This material may be readily oxidized into a silicon dioxide composition which provides the insulating layer 28 over these electrodes. A plurality of transfer electrodes 30 are provided over the insulating layer 28 and the exposed portions of the thin oxide portion 21. Thus, each of the transfer electrodes 30 is insulatingly spaced between and insulatingly overlies respective adjacent electrodes 24 and 26 of the first and second pluralities. Each of the transfer electrodes 30 is of substantially uniform extent in the direction of the length of the channel portion and extends entirely over the thin insulating portion 21 of the insulating member 20 as well as the bordering thick insulating portions thereof. The transfer electrodes may be constituted of the same material as the first and second pluralities of electrodes, that is, polycrystalline silicon suitably doped to increase the conductivity thereof. Prior to the deposition of the transfer electrodes, the surface of the semiconductor substrate underlying the exposed part of thin portion 21 of insulating member 20 is increased in conductivity by more heavily doping these surface regions with impurities, for example by ion implantation, for increasing the threshold voltage for inversion of the semiconductor surface below the transfer electrodes. Thus, with the same voltage level applied to the transfer electrodes 30 as is applied to the electrodes of the first and second pluralities, the surface potential in the substrate underlying the transfer electrodes would be greater, that is less inverted, than the surface potential underlying the electrodes of the first and second pluralities. Thus, a reduced number of voltages applied to the electrodes are required for functioning of the apparatus, as will be more fully explained below.

All of the electrodes 24 of the first plurality are connected to a common line 25 to which a $\phi_D$ voltage is applied. All of the electrodes of the second plurality are connected to a common line 27 to which a voltage $\phi_C$ is applied. All of the transfer electrodes 30 immediately preceding, that is on the left-hand side or the charge input side of the electrodes 24 of the first plurality, are connected to a common line 31 to which a $\phi_D'$ voltage is applied. These electrodes are designated as the first plurality of transfer electrodes. All of the transfer electrodes 30 located on the output side of the electrodes 24 of the first plurality or on the input side of the electrodes 26 of the second plurality are connected to the common line 32 to which a $\phi_C'$ voltage is applied. These transfer electrodes are designated as the second plurality of transfer electrodes. The voltages $\phi_D$, $\phi_C$, $\phi_D'$, and $\phi_C'$, applied to the lines 25, 27, 31 and 32 are shown in FIG. 3.

Figure 4A:
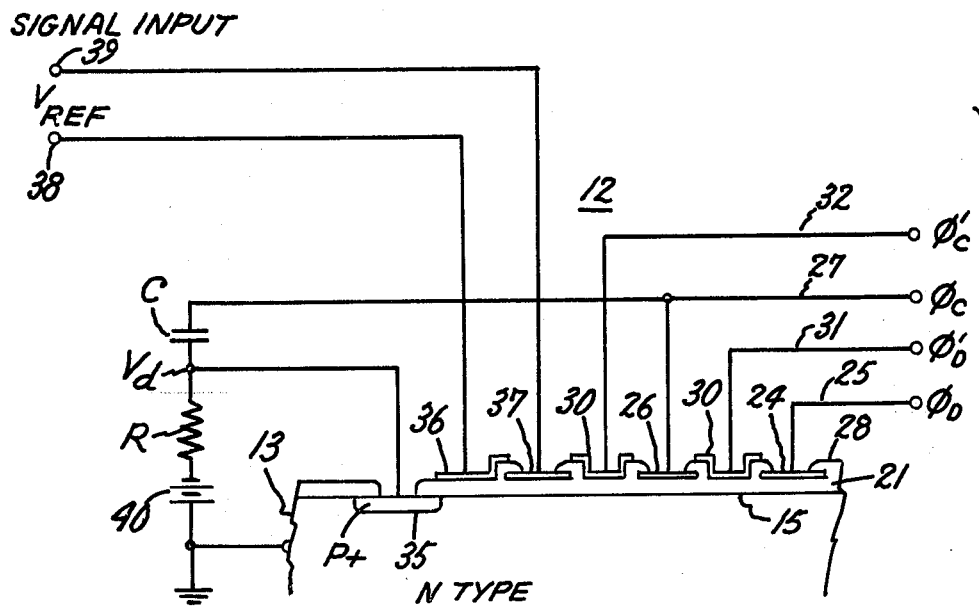
FIG. 4A is a sectional view of the charge input or sampling section of the apparatus of FIGURES 1 and 2 including a diagram of semiconductor surface potential versus distance along the surface of semiconductor substrate useful in explaining the manner in which charge is inserted or introduced into the charge transfer shift register.

Also provided in the embodiments of FIGS. 1 and 2, and also shown in FIG. 4A, is apparatus for serially forming and inserting or introducing packets of charge into the first stage of the main section 11 of the shift register in synchronism with the clocking voltages applied to the electrodes of the shift register representing samples of an applied analog signal. The first stage of the main section 11 of the shift register comprises, in the order named, a transfer electrode 30 connected to line 32, referred to as a $\phi_C$ electrode, a storage electrode 26 connected to line 27, referred to as a $\phi_C$ electrode, a transfer electrode 30 connected to line 31, referred to as a $\phi_D$, electrode, and a storage electrode 24 connected to line 25, referred to as a $\phi_D$ electrode. The charge input section 12 includes a source of charge in the form of a P-type conductivity region 35 of elongated configuration orthogonally disposed with respect to the length of the channel portion 14 and located at the left-hand end thereof. The charge input section 12 also includes a first or reference electrode 36 and a second or signal electrode 37 serially arranged in the order recited between the P region 35 and the first stage of the main shift register. The second electrode 37 is identical to the electrodes 24 of the first plurality. The second electrode 37 overlies the thin insulating portion 21, is orthogonal to the length thereof and is also of the same width as electrode 24 in the direction of the length of the channel portion 14. The first and second electrodes 36 and 37 overlie the thin portion 21 and are orthogonal to the length thereof. Each of the first and second electrodes extend completely over the thin insulating portion 21 of the insulating member as well as the bordering thick insulation portions thereof. The second electrode is constituted of the same conductive material and formed at the same time as the electrodes 24 of the first plurality. The first electrode is constituted of the same material as the transfer electrodes 30 and is formed at the same time as they are. The left-hand side of the first electrode 36 insulatingly overlies the P region 35, and the right-hand side thereof insulatingly overlies the second electrode 37. The first electrode of the first stage, that is, a transfer electrode 30 of the second plurality, insulatingly overlies the second electrode 37. The first electrode 36 is connected to a terminal 38 to which a reference voltage $V_{ref}$ is applied for establishing a reference surface potential in the semiconductor substrate underlying this electrode. The second electrode 37 is connected to a terminal 39 to which an analog voltage signal, commonly a bipolar signal and a d.c. bias, is applied for establishing in the semiconductor substrate underlying this electrode a surface potential varying in accordance with the amplitude of the analog voltage signal. The P region 35 is connected through a resistance R to the negative terminal of a source 40 of d-c potential, the positive terminal of which is connected to ground and to substrate 13 through conductive layer 34. Conductive layer 34 is constituted of a suitable material such as gold and is bonded to the lower surface of the substrate 13 and forms an ohmic contact therewith. The P region 35 is also connected through a differentiating capacitance C to line 27 tio which $\phi_C$ voltage is applied. The manner in which the various electrodes of the input section are biased and operationally function to provide charge packets to the first stage of the shift register in accordance with the present invention will be explained below in connection with FIGS. 4A, 4B and 4C.

There is also provided in the embodiment of FIGS. 1 and 2 an output section 16 for sensing packets of charge after passing through the shift register and developing an output therefrom. To this end regions 42 and 43 of P-type conductivity are provided spaced apart at the right-hand end of the channel portion 40 and functioning as the source and drain respectively of transistor 44. The P regions 42 and 43 are of elongated configuration with their long dimensions parallel to the width dimension of the channel portion 14. Electrode 45 is similar to electrode 26 and insulatingly overlies the part of channel portion 40 between the source and drain regions 42 and 43 and functions as the gate of the transistor 44. The electrode 24 of the last stage of the main section 11 of the shift register partially overlaps the P region 42. The gate electrode 45 is connected to line 27 which provides $\phi_C$ clocking voltage. The drain 43 is connected to a voltage $V_3$ which lies below the surface potential of the empty storage region underlying a $\phi_D$ electrode 24. Thus, when a storage region underlying a $\phi_C$ electrode 26 of the shift register 11 is receiving charge the transistor 44 is turned on and a precharge voltage is applied to the region 42. During the next portion of the clock cycle when charge is transferring from a storage region underlying a $\phi_C$ electrode 26 to a storage region underlying a $\phi_D$ electrode 24, the storage region underlying the $\phi_C$ electrode 26 rises in potential and enables charge to flow into the region 42 and to alter its potential in accordance with the magnitude of the charge transferred. Change in voltage on the region 42 is applied to gate 51 of transistor 52 connected as a source follower in which the source 53 is connected through a source resistance 54 to ground and the drain 55 is connected to the source of precharge voltage $V_3$. A voltage proportional to the packet of charge delivered to the precharged and floated P region 42 appears across the source resistance 54.

The manner in which the packets of charge are transferred from stage to stage in the shift register 11 of FIGS. 1 and 2 will now be described in connection with the waveform diagrams of FIG. 3. Each stage of the shift register includes a $\phi_C'$ electrode 30, a $\phi_C$ electrode 26, a $\phi_D'$ electrode 30 and a $\phi_D$ electrode 24 recited in sequence in order in the direction of charge transfer in the shift register. To these electrodes are connected, respectively, the voltages $\phi_C'$, $\phi_C$, $\phi_D'$ and $\phi_D$, shown in FIG. 3. The pulse voltage $\phi_C$ and $\phi_C'$ are preferably identical and are supplied from a single terminal. The $\phi_C$ and $\phi_C'$ voltages are alternating and vary between a low potential level 45 and a high potential level 46 in respect to minority charge carriers in the substrate 13. These voltages when applied to the $\phi_C$ and the $\phi_C'$ electrodes produce surface potentials which vary between a high surface potential level to a low surface potential level for minority carriers in the substrate. As the threshold voltage of the $\phi_C'$ electrodes is higher than the threshold level of the $\phi_C$ electrodes, the surface potentials appearing under the $\phi_C'$ electrodes are higher than the corresponding surface potentials appearing under the $\phi_C$ electrodes for the same level of voltage applied thereto. The fixed voltages $\phi_D$ and $\phi_D'$, which are conveniently shown as identical, produce surface potentials in the substrate underlying the $\phi_D$ and the $\phi_D'$ electrodes which are different in view of the fact that the threshold voltages of these electrodes are different. The threshold voltage of the $\phi_D'$ electrodes is greater than the threshold voltage of the $\phi_D$ electrodes. Accordingly, the surface potential on the substrate underlying the $\phi_D'$ electrode is higher than the surface potential in the substrate underlying the $\phi_D$ electrode for minority carriers for the same level of applied voltage. The $\phi_D$ voltage is set to have a level 47 lying between the lower level 45 and upper level 46 of the $\phi_C$ voltage. The $\phi_D'$ voltage is also set to lie between the lower and upper levels of the $\phi_C$ voltage. At time $t_1$, the $\phi_C$ and the $\phi_C'$ voltages rise from the low level 45 to the high level 46 thereby providing surface potentials underlying the $\phi_c$ and the $\phi_c'$ electrodes which are higher than the surface potential of the regions underlying the $\phi_D$ and the $\phi_D'$ electrodes. As the surface potential underlying the $\phi_C'$ electrodes are always greater than the surface potential underlying the $\phi_C$ electrodes, charge in the $\phi_C$ storage region is inhibited from flowing in the direction of the region underlying the $\phi_C'$ electrodes and flows instead from left to right from the $\phi_C$ storage regions through the region underlying the $\phi_D'$ region into the storage region underlying the $\phi_D$ electrode. Thus, as potential of the storage regions underlying the $\phi_D$ electrodes are now lower than the potentials of the storage regions underlying the $\phi_C$ electrodes, charge can flow from the $\phi_C$ electrodes over the potential barrier underlying the $\phi_D'$ electrodes into the $\phi_D$ storage regions. At time $t_3$ both the $\phi_C$ and the $\phi_C'$ voltage drop from the upper level 46 to the lower level thereof setting the surface potentials in the surface regions underlying the $\phi_C$ electrodes at a value below the surface potential underlying the $\phi_D$ electrodes with the surface potential underlying the $\phi_D$ electrodes higher than the surface potential underlying the $\phi_C$ electrodes. Thus, during the time interval $t_3$ to $t_4$ charge from the storage regions underlying the $\phi_D$ electrodes flows into the storage regions underlying the $\phi_C$ electrodes, thereby completing a cycle of charge transfer in the shift register. In subsequent clocking cycles the cycle is repeated to cause charge to be clocked from left to right in the shift register.

Referring to FIG. 3, the voltage waveform designated $V_d$ shows the voltage appearing on the P-type conductivity region 35. Voltage $V_d$ is developed as a result of applying the voltage $\phi_C$ to the differentiating circuit of FIGS. 1 and 2 consisting of the capacitance C and the resistance R. The voltage appearing across resistance R is then applied in series with the bias voltage of source 40 between the P region 35 and the substrate. The level $S_O$ represents the bias voltage applied by the source 40 to the P region 35. The potential level $S_1$ represents the surface potential existing in the semiconductor substrate underlying the first electrode or reference electrode 36 as the result of applying reference voltage $V_{ref}$ to this electrode with respect to the substrate. At time $t_1$ the voltage $\phi_C$ rises abruptly to its high level thereby raising the potential on the P region 35 to a corresponding high level above the level $S_1$. During the time interval $t_1$ to $t_3$ the charge on the capacitance C decays through resistance R and the voltage of the P region 35 drops exponentially to level $S_O$. The time constant of the differentiating circuit consisting of the resistance R and the capacitance C is set to be less than about one-half of the interval $t_1$ to $t_2$ so that the time interval $t_1$ to $t_2$ during which the voltage rises above the surface potential $S_1$ underlying the first electrode 36 or reference electrode is a small fraction of the interval $t_1$ to $t_3$. Thus, during a first portion of a clock cycle the voltage waveform $V_d$ has an initial part represented by interval $t_1$ to $t_2$ during which the voltage rises above the potential $S_1$ of the surface of the substrate underlying the reference electrode 36 and has a remaining part represented by time interval $t_2$ to $t_3$ during which the voltage $V_d$ is below the potential $S_1$. The initial part of the first portion of a clocking cycle $t_1$ to $t_3$ is referred to as the "fill" portion of the cycle. The remaining part of the first portion of the clock cycle $t_2$ to $t_3$ is referred to as the "spill" portion of the cycle. The "fill and spill" portions of the cycle occur while the voltage $\phi_C$ is high and hence in a position to transfer charge stored in the $\phi_C$ storage regions to the $\phi_D$ storage regions. At time $t_3$ the voltage $\phi_C$ falls abruptly to its low level thereby lowering the potential on P region 35 to a corresponding low level below the level $S_O$. During the time interval $t_3$ to $t_4$ the charge on the capacitance C decays through resistance R and the voltage of the P region 35 rises exponentially to level $S_O$. During the second portion of the clocking cycle the voltage $\phi_C$ is low and hence the storage regions underlying the $\phi_C$ electrodes are at a potential to receive charge from the storage regions underlying the $\phi_D$ electrodes or other electrodes at a suitable potential for transferring charge to the $\phi_C$ storage regions. During this portion of a clocking cycle voltage $V_d$ is no greater than the bias voltage $S_O$ and is initially at a voltage substantially lower than this voltage; hence, no additional charge is introduced into the storage region underlying the second or signal electrode 37.

Figure 4B:
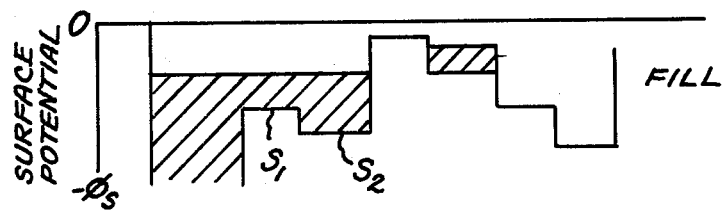
FIGS. 4B and 4C are diagrams of semiconductor surface potential versus distance along the surface of the semiconductor substrate at other points in time in the cycle of forming a packet of charge for insertion into the charge transfer shift register of FIG. 8A.
Figure 4C:
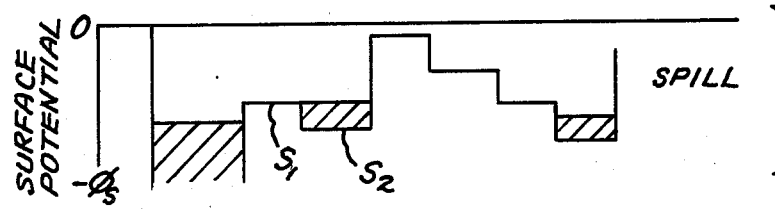

The manner in which charge is developed and transferred to the first stage of the shift register of FIG. 1 and 2 is shown in FIGS. 4A, 4B and 4C. FIG. 4A shows a portion of the apparatus of FIG. 2 depicting the input section of the apparatus including one-half of the first stage including the $\phi_C'$ and $\phi_C$ electrodes. The parts of the apparatus of FIG. 4A identical to the parts of the apparatus of FIG. 2 are identically designated. FIGS. 4A, 4B and 4C show the potential existing at the surface of the semiconductor substrate as a function of distance along the surface at respective successive intervals of time upon the application of the voltages of the form shown in FIG. 3, namely, $\phi_C$, $\phi_C'$, $\phi_D$ and $\phi_D'$, and in particular the application of the voltage $\phi_C$ to the differentiating circuit associated with the region 35 of opposite conductivity type to produce the waveform $V_d$. FIG. 4A also shows the surface potentials existing at a point in time in the interval $t_1$ to $t_2$, referred to as the "fill" portion of the input cycle. FIG. 4B shows the surface potentials existing at a point time in the interval $t_2$ to $t_3$, referred to as the "spill" portion of the input cycle. FIG. 4C shows the surface potential existing at a point in time in the interval $t_3$ to $t_4$, referred to as the transfer portion of the input cycle, during which no further change interchange occurs in the input section and the charge developed therein is transferred to the first stage of the shift register 11. With the voltages $\phi_C$, $\phi_C'$, $\phi_D$ and $\phi_D'$ applied to the shift register and the voltage $\phi_C$ applied to the differentiating circuit associated with the source 35 to develop the waveform $V_d$ on the potential source 35, the operation of the input section of the apparatus over a clock cycle is as follows. At time $t_1$, the potential of the P-type region 35 rises above the surface potential $S_1$ appearing in the first region underlying the first electrode 36 and remains above this potential over the interval $t_1$ to $t_2$, thereby causing charge to flow through the first region into the second region in which a surface potential $S_2$ has been established by applying a signal voltage to a second or signal electrode 37. At time $t_2$, the potential of the P-type region 35 falls below the potential $S_1$ of the first region and accordingly excess charge appearing in the second storage region spills over the potential barrier formed in the first region back into the P-type region 35 until the surface potential in the second region equilibrates with the surface potential $S_1$ in the first region. This occurs during the "spill" interval $t_2$ to $t_3$. The size of this packet of charge varies linearly with the difference in potential between $S_2$ and $S_1$ which varies linearly with difference in voltage applied to the reference electrode 36 and the signal electrode 37 and is to a first order independent of threshold voltages and temperature. Thus, a packet of charge is formed, the magnitude of which represents the amplitude of the analog input signal on electrode 37 at the instant of time substantially at $t_3$. During the second portion of the clocking cycle, the voltages $\phi_C$ and $\phi_{C'}$ drop to their low level and the voltage appearing on the $\phi_{C'}$ electrode of the first stage conveniently referred to as the third electrode and also the voltage on the $\phi_C$ electrode of the first stage conveniently referred to as the fourth electrode, also drop to their low level. Thus, the surface potentials of the regions underlying the third and fourth electrodes fall below the surface potential represented by the signal level $S_2$ and the charge packet is caused to flow from the second storage region into the fourth storage region, as illustrated in FIG. 4C, thereby completing a charge sample and transfer cycle during a clocking cycle of the shift register. During the second portion of the clocking cycle, the voltage on the P-type region 35 initially drops to a value considerably below the level $S_O$ and then rises to this level. Accordingly, the action of the differentiating circuit does not affect the transfer of the sample of charge into the first stage of the shift register.

Thus, a charge input circuit is provided which is operative in response to a single clocking voltage to provide a "fill" and a "spill" part in a first portion of a clocking cycle to develop a packet of charge and during a second portion of the clocking cycle to transfer the packet of charge from the input section to the first stage of a shift register or other form of charge transfer apparatus. Preferably, the time constant of the input circuit is a small fraction of the time of the first portion of the clocking cycle so that the storage region in which the signal sample packet is developed can be quickly filled and an adequate time can be allowed for equilibration and the development of a charge packet which is an accurate representation of the signal sample. This circuit does not rely on fall times of clocking cycles for the spill portion of the input cycle. With higher frequency clocking pulses, of course, the time constant of the input circuit is changed so as to maintain adequate "spill" time in the first portion of the clocking cycle.

In order to provide a stable surface potential underlying the reference electrode 36 an additional electrode may be provided between this electrode and the P region 35. In this case, the reference electrode 36 would be identical in form to a transfer electrode and the additional isolation electrode would be identical to either electrode 24 or electrode 26. This electrode would be connected to a potential source providing a surface potential in the region of the substrate lying thereunder in the absence of charge which is lower than the surface potential in the region of the substrate underlying the reference electrode 36. This additional electrode would be provided with a stable constant voltage source which would inhibit distortion of the surface potential profile underlying the reference electrode 36. This additional electrode could also function by application of suitable potential thereto to inhibit the transfer of charge to the storage region underlying the signal electrode 37 such as would be desirable when the device is to be utilized in combination with other devices in a selective or multiplexed mode of operation.

As described above, the packets of charge transferred from stage to stage of the shift register are sensed in the output circuit 16 and an output developed across resistance 54. As pointed out above the clock voltage $\phi_C$ is utilized for functioning the circuit to precharge the P region 42 during the first portion of the clocking cycle and thereafter during the second portion of the clocking cycle to float the P region 42. During the second portion of the clocking cycle, when the $\phi_C$ electrode thereof is at its high level, charge from the last stage of the shift register 11 is transferred into the floating P region 42. The resultant change in potential on the P region 42 appears at the output of the source follower 52. Thus, charge transfer apparatus is provided in which a single clocking waveform is utilized not only in the main section thereof but also in the input and output sections thereof as well, thereby greatly simplifying the fabrication thereof as well as improving the operation thereof.

While the invention has been described in connection with the processing of analog signals, it is apparent that the invention is equally applicable to digital signals.

While the invention has been described in a form in which a single clocking waveform is utilized for charge transfer apparatus, it is apparent that the invention is applicable to charge transfer apparatus clocked by multiphased voltages.

While the invention has been described in connection with charge transfer apparatus including a single shift register it is apparent that a plurality of such shift registers could be included on the same substrate and operated as desired. Also, the input structure of the invention could be utilized in charge transfer apparatus other than shift registers, for example in charge transfer apparatus such as described in U.S. Pat. No. 4,058,717 in which packets of charge are transferred in parallel to a plurality of charge storage stages and processed outputs are derived on an electrode common to all of the charge storage stages.

While the invention has been described in connection with apparatus constituted of N-type conductivity substrates P-type conductivity substrates could as well be used. Of course, in such case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What is claimed is:

1. Charge transfer apparatus comprising
   a semiconductor substrate of one conductivity type having a major surface, a first electrode insulatingly overlying a first region of said substrate adjacent said major surface, a second electrode insulatingly overlying a second region of said substrate adjacent said major surface and contiguous to said first region, a region of opposite conductivity type in said major surface and coupled to said first region, means for applying a reference voltage to said first electrode to establish a surface potential in said first region corresponding to said reference voltage, means for applying a signal voltage to said second electrode to establish a surface potential in said second region corresponding to said signal, means for biasing said region of opposite conductivity type to provide a surface potential therein of a value unfavorable for the transfer of charge from said region of opposite conductivity type to said first region, a third electrode insulatingly overlying a third region of said substrate adjacent said major surface and contiguous to said second region, a fourth electrode insulatingly overlying a fourth region of said substrate adjacent said major surface and contiguous to said third region, means for applying a first clock voltage to said third electrode to establish a surface potential in said third region corresponding to said first clock voltage, means for applying a second clock voltage to said fourth electrode to establish a surface potential in said fourth region corresponding to said second clock voltage, said second clock voltage having a first value over a first portion of a cycle thereof which is unfavorable for the transfer of charge from said second region to said fourth region and having a second value over a second portion of said cycle which is favorable for the transfer of charge from said second region to said fourth region, said first clock voltage having a first value during said first portion of said cycle of said second clock voltage which inhibits the transfer of charge from said second region to said fourth region and having a second value during said second portion of said cycle of said second clock voltage which enables the transfer of charge from said second region to said fourth region, passive circuit means responsive to the transition in level of said second clock voltage from said second value to said first value to develop and apply a transient voltage of a polarity, amplitude and duration to said region of opposite conductivity type to render the potential of said region of opposite conductivity type favorable for the transfer of charge from said region of opposite conductivity type into said first region and to said second region over an initial part of said first portion of said cycle of said second clock voltage and favorable for the transfer of charge from said first region to said region of opposite conductivity during the remaining part of said first portion of said cycle, said circuit means developing a voltage on said region of opposite conductivity type during said second portion of said cycle which is unfavorable for the transfer of charge from said region of opposite conductivity type to said first region, whereby during said first portion of said second clock voltage a packet of charge is developed in said second region, the magnitude of which is dependent on the separation in potential of said signal voltage from said reference voltage in the direction favorable to the transfer of charge from said first region to said second region, and during said second portion of said cycle of said second clock voltage said packet of charge is transferred from said second region to said fourth region.

2. The apparatus of claim 1 in which said first clock voltage and said second clock voltage are identical.

3. The apparatus of claim 1 in which said circuit means includes a resistance connected in circuit between said region of opposite conductivity type and said substrate and a capacitance connected in circuit with said region of opposite conductivity type and said means for applying said second clock voltage, the time constant of said resistance and said capacitance being a fraction of the first portion of a cycle of said second clock voltage.

4. The apparatus of claim 1 in which said signal is an analog signal.

5. The apparatus of claim 1 in which said third and fourth electrodes comprise a stage of charge storage and transfer channel.

* * * * *